United States Patent
Chen et al.

(10) Patent No.: US 10,177,511 B2
(45) Date of Patent: Jan. 8, 2019

(54) ELECTRICAL CONNECTOR

(71) Applicant: LOTES CO., LTD, Keelung (TW)

(72) Inventors: Guang Chen, Keelung (TW); De Fang Hu, Keelung (TW); Li Ming Zhang, Keelung (TW)

(73) Assignee: LOTES CO., LTD, Keelung (TW)

( * ) Notice: Subject to any disclaimer, the term of this patent is extended or adjusted under 35 U.S.C. 154(b) by 0 days.

(21) Appl. No.: 15/834,533

(22) Filed: Dec. 7, 2017

(65) Prior Publication Data
US 2018/0226758 A1   Aug. 9, 2018

(30) Foreign Application Priority Data

Feb. 9, 2017   (CN) ..................... 2017 2 0118145 U

(51) Int. Cl.
| | | |
|---|---|---|
| *H01R 24/00* | (2011.01) | |
| *H01R 24/60* | (2011.01) | |
| *H01R 12/70* | (2011.01) | |
| *H01R 12/58* | (2011.01) | |
| *H01R 43/02* | (2006.01) | |
| *H01R 107/00* | (2006.01) | |
| *H05K 3/34* | (2006.01) | |

(52) U.S. Cl.
CPC ............ *H01R 24/60* (2013.01); *H01R 12/58* (2013.01); *H01R 12/7082* (2013.01); *H01R 43/0256* (2013.01); *H01R 2107/00* (2013.01); *H05K 3/3447* (2013.01); *H05K 2201/10189* (2013.01)

(58) Field of Classification Search
CPC ............... H01R 24/60; H01R 13/5202; H01R 13/6585; H01R 9/03; H01R 12/7082
USPC ........................................................ 439/676
See application file for complete search history.

(56) References Cited

U.S. PATENT DOCUMENTS

| | | | | |
|---|---|---|---|---|
| 9,735,511 | B2* | 8/2017 | Kao ................... | H01R 13/5202 |
| 2017/0040721 | A1* | 2/2017 | Tsai .................... | H01R 13/502 |
| 2018/0097298 | A1* | 4/2018 | Ju ........................ | H01R 9/03 |
| 2018/0115119 | A1* | 4/2018 | Little ................. | H01R 13/6585 |

FOREIGN PATENT DOCUMENTS

| | | |
|---|---|---|
| CN | 104882689 A | 9/2015 |
| CN | 105428854 A | 3/2016 |
| CN | 205081305 U | 3/2016 |

(Continued)

*Primary Examiner* — Jean F Duverne
(74) *Attorney, Agent, or Firm* — Locke Lord LLP; Tim Tingkang Xia, Esq.

(57) ABSTRACT

An electrical connector includes an insulating body having a base, and multiple upper row terminals and multiple lower row terminals fixed in the insulating body. Each terminal has a soldering portion respectively extending out of the base. The upper row terminals include at least one upper row signal terminal, and the lower row terminals include at least one lower row signal terminal. The soldering portion of the upper row signal terminal is in contact with the soldering portion of the lower row signal terminal. By means of contact between the soldering portions of the upper row and lower row signal terminals, a transmission signal of the upper row signal terminal and a transmission signal of the lower row signal terminal are directly combined, and the signals do not need to be combined by other means. The transmission current is larger due to more conducted parts in the electrical connector.

19 Claims, 8 Drawing Sheets

(56) References Cited

FOREIGN PATENT DOCUMENTS

| | | |
|---|---|---|
| CN | 205159558 U | 4/2016 |
| CN | 205282692 U | 6/2016 |
| TW | M506400 U | 8/2015 |

\* cited by examiner

ELECTRICAL CONNECTOR

CROSS-REFERENCE TO RELATED APPLICATION

This non-provisional application claims priority to and benefit of, under 35 U.S.C. § 119(a), Patent Application No. 201720118145.0 filed in P.R. China on Feb. 9, 2017, the entire content of which is hereby incorporated by reference.

FIELD OF THE INVENTION

The present invention relates to an electrical connector, and more particularly to an electrical connector having a larger transmission current.

BACKGROUND OF THE INVENTION

With the development of an electronic technology, an electronic connector tends to transmit a signal at a high speed increasingly. A universal serial bus (USB)2.0 electronic connector is developed to a USB3.0 electronic connector having a higher transmission speed, so as to meet demands for high-speed signal transmission of an electrical connector in nowadays society.

An existing USB TYPE C electrical connector includes an insulating body. The insulating body is provided with multiple upper row conductive terminals and lower row conductive terminals. Each terminal has a fixing portion and a soldering portion extending backward from the fixing portion. The fixing portion is fixed to the insulating body, and the soldering portion is soldered to a circuit board so as to be grounded. A shielding shell is sleeved over the insulating body and used for shielding external signal interference on a signal terminal.

In practical application, the USB3.1 Type-C connector needs to allow insertion of a mating connector in dual orientation. So, signal terminals of the upper row conductive terminal and the lower row conductive terminal need to be axially symmetric in a front-rear direction. For example, the upper row conductive terminal includes a first differential signal receiving terminal and a first differential signal sending terminal, distributed from left to right; the lower row conductive terminal includes a second differential signal sending terminal and a second differential signal receiving terminal, distributed from left to right. Although signals transmitted by the first differential signal receiving terminal and the second differential signal receiving terminal are consistent, the signals are distributed in a skew intersection manner in an up-down direction. So, after mounting of all the conductive terminals is completed, the first and second differential signal receiving terminals need to be soldered via a conductor or other manners for combining signals in a subsequent procedure, thus cause a complicated procedure.

Further, a soldering portion of each terminal is independently soldered to corresponding one soldering hole in the circuit board, thereby causing some time-consuming and labor-consuming problems. For example, the circuit board must be processed with more procedures, and soldering holes corresponding to the soldering portions of the terminals in quantity are formed in the circuit board. In addition, if the soldering portion of each terminal is not accurately wrapped during tin soldering, the soldering portion and the circuit board will poorly contact each other, and effective conduction cannot be performed.

Therefore, a heretofore unaddressed need exists in the art to address the aforementioned deficiencies and inadequacies.

SUMMARY OF THE INVENTION

In one aspect, the present invention relates to an electrical connector having a larger transmission current by enabling a soldering portion of an upper row signal terminal and a soldering portion of a lower row signal terminal to contact with each other for signal combination.

In certain embodiments, an electrical connector includes an insulating body and multiple upper row terminals and multiple lower row terminals fixed in the insulating body. Each upper row terminal and each low-row terminal respectively have a soldering portion extending out of a base of the insulating body. The multiple upper row terminals include at least one upper row signal terminal. The multiple lower row terminals include at least one lower row signal terminal. The soldering portion of the upper row signal terminal is in contact with the soldering portion of the lower row signal terminal.

In certain embodiments, the soldering portion of the upper row signal terminal and the soldering portion of the lower row signal terminal are in plate surface contact.

In certain embodiments, the upper row signal terminal includes an upper row positive terminal, the lower row signal terminal includes a lower row positive terminal, and the soldering portion of the upper row positive terminal and the soldering portion of the lower row positive terminal are in plate surface contact.

In certain embodiments, the multiple upper row terminals include at least one upper row ground terminal, at least one upper row power terminal and at least one upper row detection terminal, the upper row signal terminal includes an upper row positive terminal and an upper row negative terminal, the multiple lower row terminals include at least one lower row ground terminal, at least one lower row power terminal and at least one lower row detection terminal, and the lower row signal terminal includes a lower row positive terminal and a lower row negative terminal.

In certain embodiments, the soldering portions of the multiple upper row terminals are arranged in a first row and a second row front and back, the soldering portion of the upper row ground terminal, the soldering portion of the upper row power terminal and the soldering portion of the upper row positive terminal are located in the first row, the soldering portion of the upper row detection terminal and the soldering portion of the upper row negative terminal are located in the second row, and the soldering portions of the multiple lower row terminals and the first row are arranged in a row.

In certain embodiments, the soldering portion of the upper row ground terminal is in contact with the soldering portion of the lower row ground terminal, and the soldering portion of the upper row power terminal is in contact with the soldering portion of the lower row power terminal.

In certain embodiments, the insulating body further includes a tongue extending from one side of the base, the multiple upper row terminals are exposed upward from the tongue, the multiple lower row terminals are exposed downward from the tongue, and a shielding shell is sleeved over the tongue to form an insertion space.

In another aspect, the present invention relates to an electrical connector used for being electrically connected to a circuit board. The circuit board includes at least one soldering hole. The electrical connector includes an insulating body and multiple upper row terminals and multiple lower row terminals fixed in the insulating body. Each upper row terminal and each low-row terminal respectively have a soldering portion extending out of a base of the insulating body. The multiple upper row terminals include at least one upper row signal terminal, the multiple lower row terminals include at least one lower row signal terminal, and the soldering portion of the upper row signal terminal and the soldering portion of the lower row signal terminal contact each other and are located in the same soldering hole.

In certain embodiments, the soldering portion of the upper row signal terminal and the soldering portion of the lower row signal terminal are in plate surface contact.

In certain embodiments, the upper row signal terminal includes an upper row positive terminal, the lower row signal terminal includes a lower row positive terminal, and the soldering portion of the upper row positive terminal and the soldering portion of the lower row positive terminal contact each other and are located in the same soldering hole.

In certain embodiments, the soldering portion of each upper row terminal and the soldering portion of each lower row terminal are respectively soldered to the circuit board by a through hole technology.

In certain embodiments, the multiple upper row terminals include at least one upper row ground terminal, at least one upper row power terminal and at least one upper row detection terminal, the upper row signal terminal includes an upper row positive terminal and an upper row negative terminal, the multiple lower row terminals include at least one lower row ground terminal, at least one lower row power terminal and at least one lower row detection terminal, and the lower row signal terminal includes a lower row positive terminal and a lower row negative terminal.

In certain embodiments, the soldering portions of the multiple upper row terminals are arranged in a first row and a second row front and back, the soldering portion of the upper row ground terminal, the soldering portion of the upper row power terminal and the soldering portion of the upper row positive terminal are located in the first row, the soldering portion of the upper row detection terminal and the soldering portion of the upper row negative terminal are located in the second row, and the soldering portions of the multiple lower row terminals and the first row are arranged in a row.

In certain embodiments, the soldering portion of the upper row ground terminal and the soldering portion of the lower row ground terminal contact each other and are located in the same soldering hole, and the soldering portion of the upper row power terminal and the soldering portion of the lower row power terminal contact each other and are located in the same soldering hole.

In certain embodiments, the insulating body further includes a tongue extending from one side of the base, the multiple upper row terminals are exposed upwards to the tongue, the multiple lower row terminals are exposed downwards to the tongue, and a shielding shell is sleeved over the tongue to form an insertion space.

Compared with the related art, certain embodiments of the present invention have the following beneficial advantages:

By means of contact between the soldering portion of the upper row signal terminal and the soldering portion of the lower row signal terminal, a transmission signal of the upper row signal terminal and a transmission signal of the lower row signal terminal are directly combined, and the signals do not need to be combined by means of other procedures, thereby saving the cost. Moreover, there are more conducted parts in the electrical connector, and therefore the transmission current is larger. The soldering portion of the upper row signal terminal and the soldering portion of the lower row signal terminal contact each other and are soldered in the same soldering hole, such that the quantity of the soldering holes in the circuit board can be reduced, the processing procedures of the circuit board and space on the circuit board are saved, and the number of times for soldering can be reduced, thereby reducing the reject ratio caused by soldering error.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment.

DETAILED DESCRIPTION OF THE INVENTION

Figure 1:
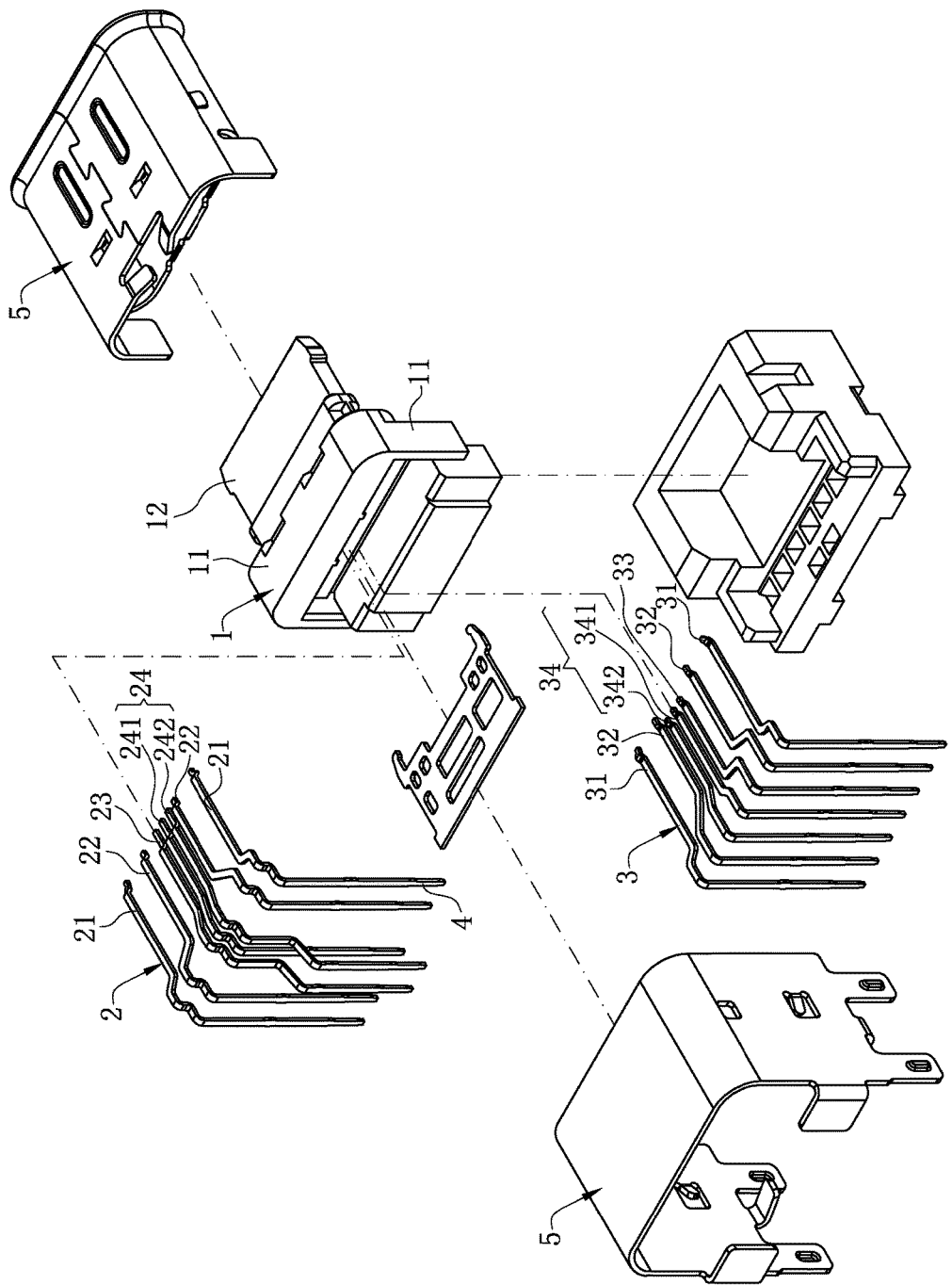
FIG. 1 is a schematic three-dimensional exploded view of an electrical connector according to one embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-8. In accordance with the purposes of this invention, as embodied and broadly described herein, this invention, in one aspect, relates to an electrical connector.

Figure 4:
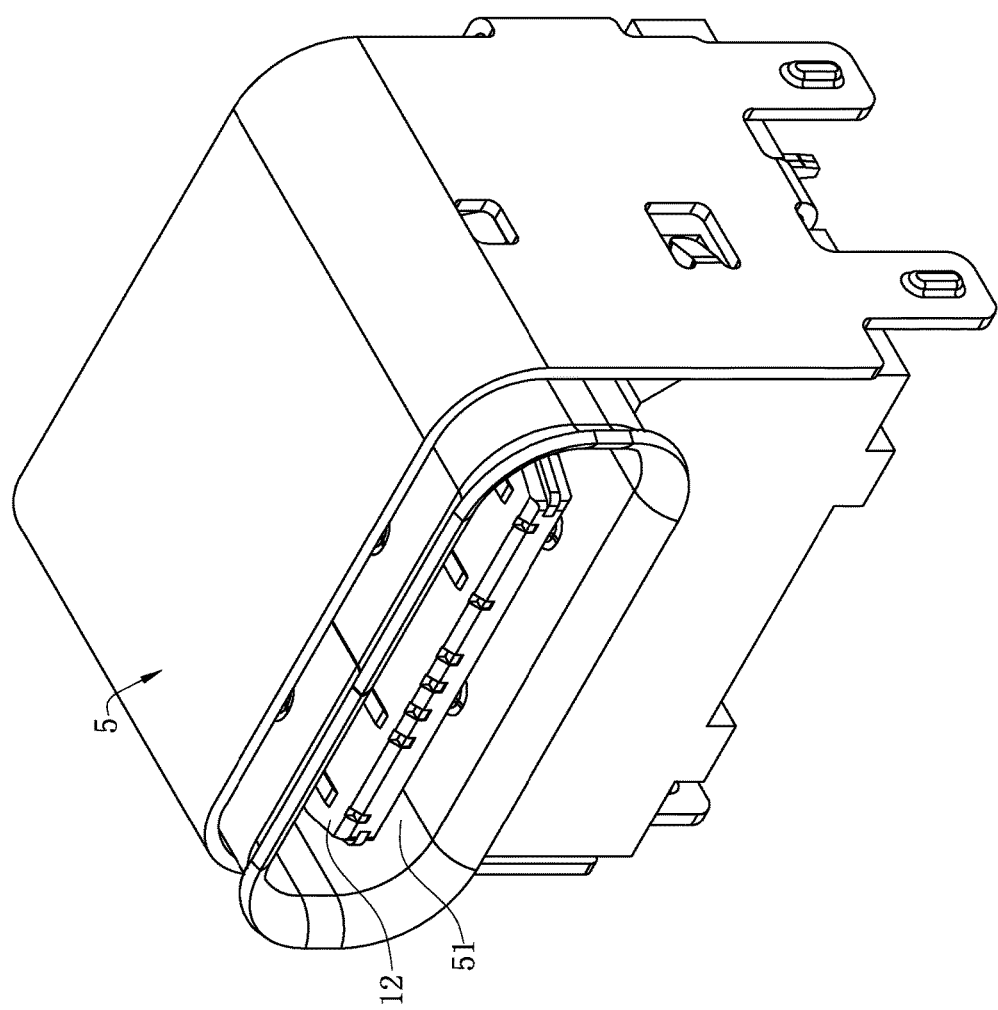
FIG. 4 is a schematic three-dimensional assembly view of the electrical connector according to one embodiment of the present invention.

As shown in FIGS. 1 and 4, an electrical connector according to one embodiment of the present invention includes an insulating body 1, multiple upper row terminals 2 and multiple lower row terminals 3 fixedly disposed in the insulating body 1, and a shielding shell 5 sleeved over the insulating body 1 to form an insertion space 51.

Figure 2:
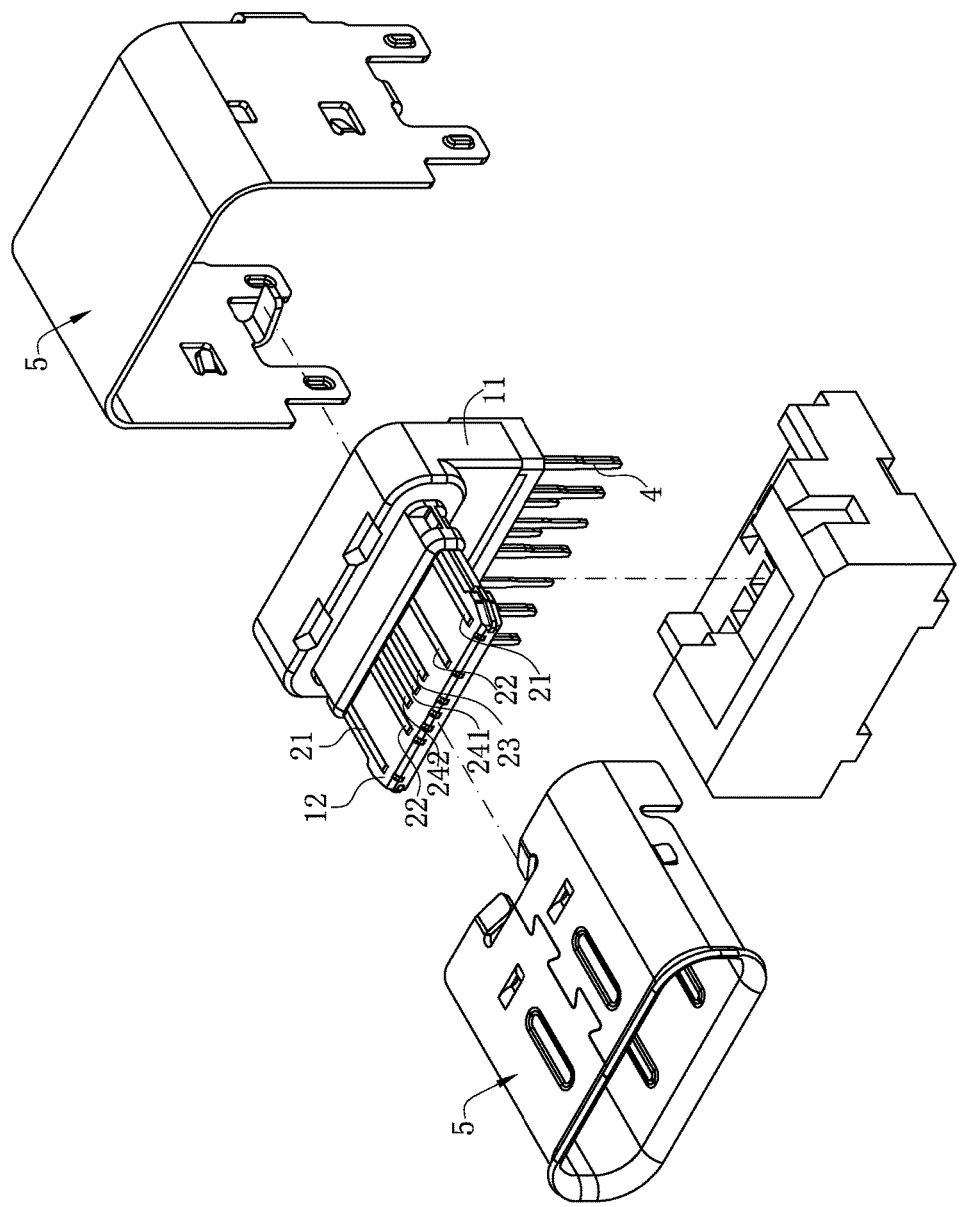
FIG. 2 is a schematic three-dimensional partial assembly view of the electrical connector according to one embodiment of the present invention.

As shown in FIG. 1 and FIG. 2, the insulating body 1 includes a base 11 and a tongue 12 extending out from a front end of the base 11.

Figure 3:
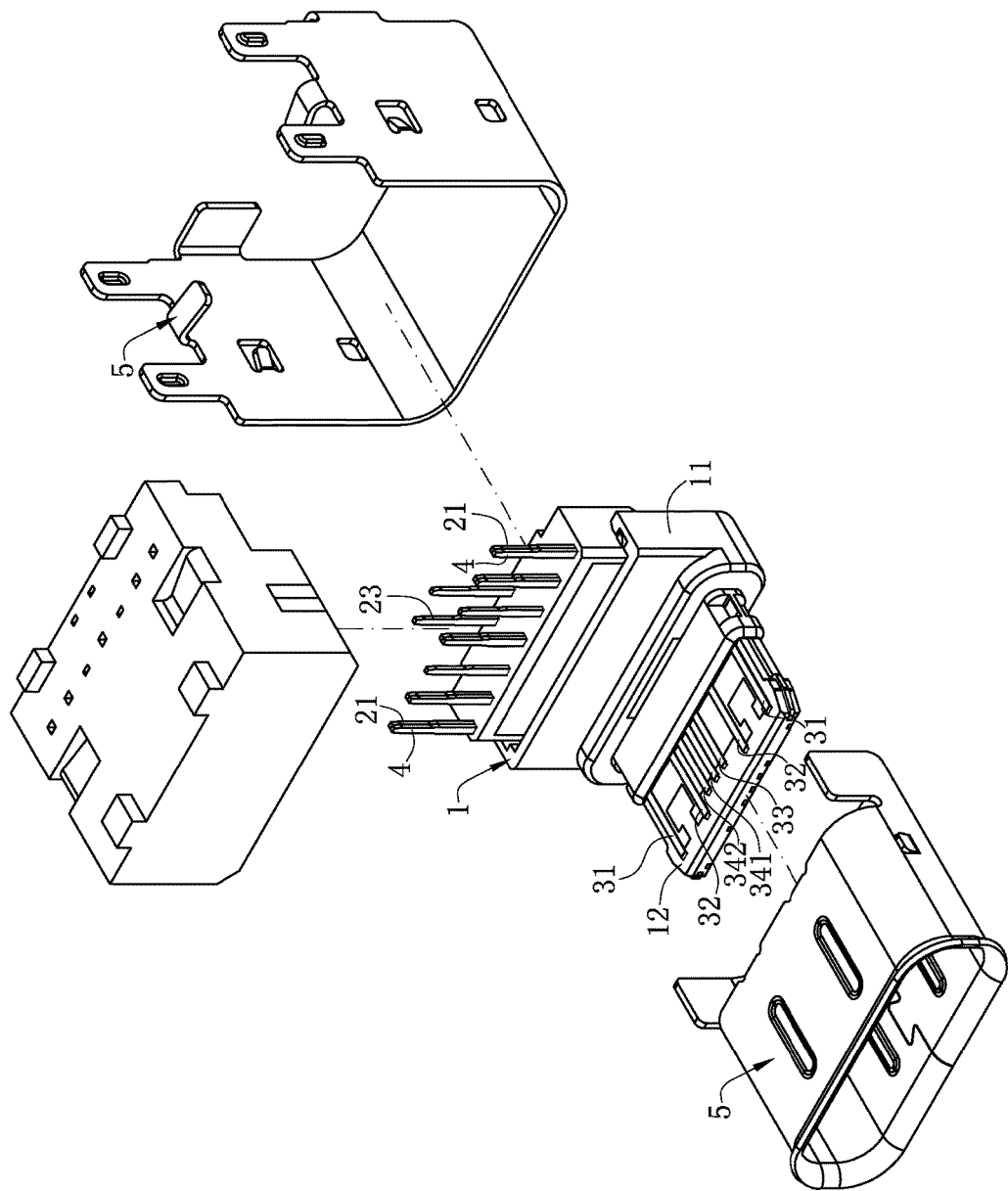
FIG. 3 is a schematic three-dimensional partial assembly view of the electrical connector according to one embodiment of the present invention viewed from another view angle.
Figure 6:
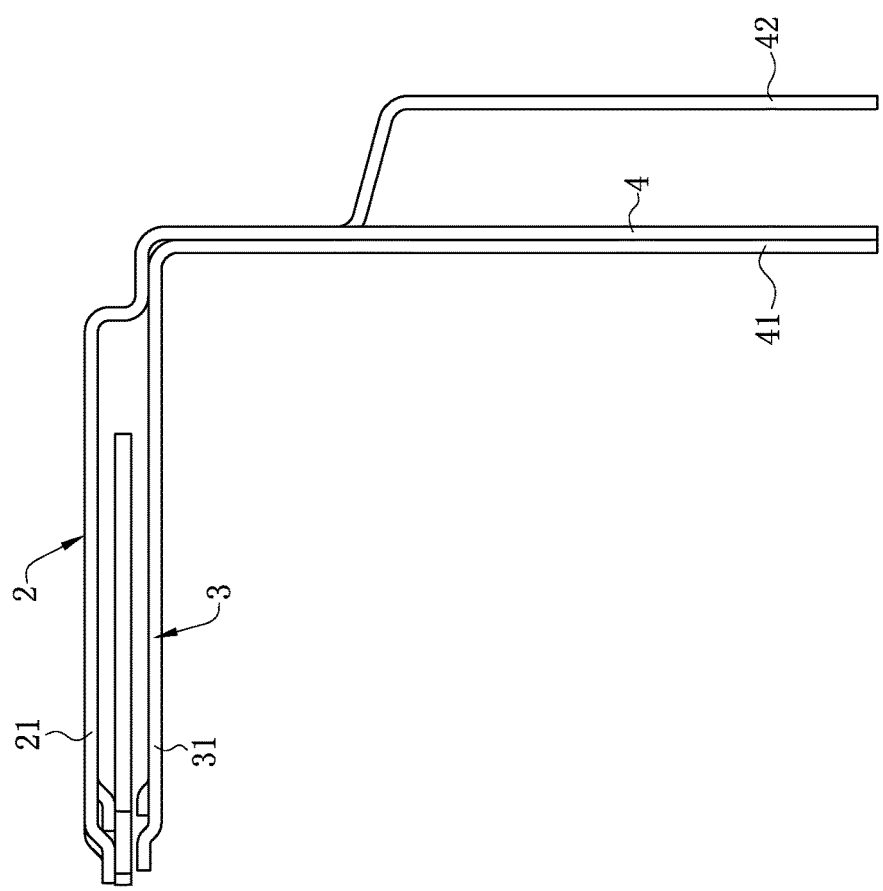
FIG. 6 is a schematic side view of the upper row terminals and the lower row terminal of the electrical connector according to one embodiment of the present invention.

As shown in FIGS. 2 and 3, the multiple upper row terminals 2 are fixedly disposed in the base 11 and exposed upward from the tongue 12, and the multiple lower row terminals 3 are fixedly disposed in the base 11 and exposed downward from the tongue 12. The multiple upper row terminals 2 and the multiple lower row terminals 3 form point symmetry by taking a central point of the insertion space 51 as a symmetry center. Each upper row terminal 2 and each low-row terminal 3 respectively have a soldering portion 4 extending out of the base 11. The multiple upper row terminals 2 include two upper row ground terminals 21, two upper row power terminals 22, two upper row signal terminals 24 and an upper row detection terminal 23. The upper row signal terminal 24 includes an upper row positive terminal 241 and an upper row negative terminal 242. The multiple lower row terminals 3 include two lower row ground terminals 31, two lower row power terminals 32, two lower row signal terminals 34 and a lower row detection terminal 33. The lower row signal terminal 34 includes a lower row positive terminal 341 and a lower row negative terminal 342. As shown in FIG. 6, the soldering portions 4 of the multiple upper row terminals 2 are arranged in a first row 41 and a second row 42 in a front and back direction. The soldering portion 4 of the upper row ground terminal 21, the soldering portion 4 of the upper row power terminal 22 and the soldering portion 4 of the upper row positive terminal 241 are located in the first row 41, the soldering portion 4 of the upper row detection terminal 23 and the soldering portion 4 of the upper row negative terminal 242 are located in the second row 42, and the soldering portions 4 of the multiple lower row terminals 3 and the first row 41 are arranged in a row.

Figure 5:
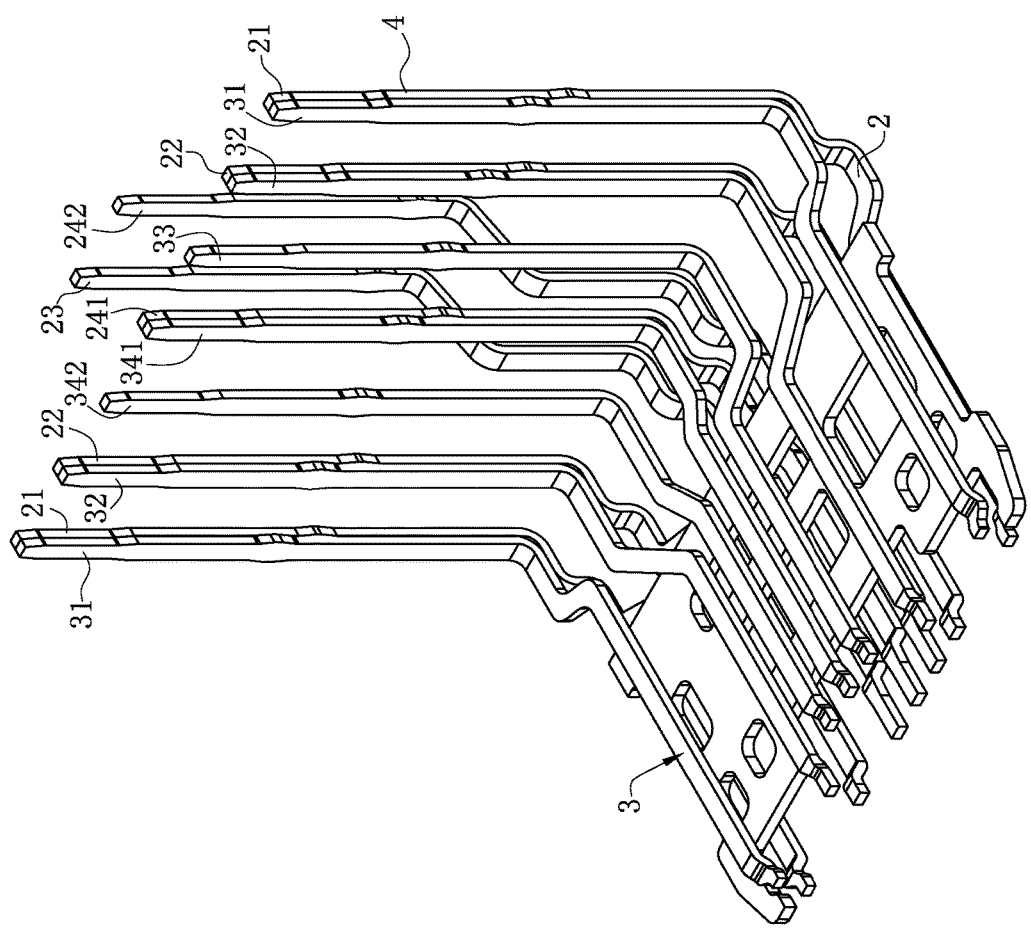
FIG. 5 is a schematic three-dimensional assembly view of upper row terminals and lower row terminals of the electrical connector according to one embodiment of the present invention.

As shown in FIG. 5, the soldering portion 4 of the upper row signal terminal 24 and the soldering portion 4 of the lower row signal terminal 34 contact each other, the soldering portion 4 of the upper row ground terminal 21 and the soldering portion 4 of the lower row ground terminal 31 contact each other, the soldering portion 4 of the upper row power terminal 22 and the soldering portion 4 of the lower row power terminal 32 contact each other, and each soldering portion 4 has a front plate surface and a rear plate surface. In the present embodiment, a contact mode between the two soldering portions 4 contacting each other is plate surface contact. Specifically, the front plate surface of the soldering portion 4 of the upper row positive terminal 241 and the rear plate surface of the soldering portion 4 of the lower row positive terminal 341 contact each other, the front plate surface of the soldering portion 4 of the upper row ground terminal 21 and the rear plate surface of the soldering portion 4 of the lower row ground terminal 31 contact each other, and the front plate surface of the soldering portion 4 of the upper row power terminal 22 and the rear plate surface of the soldering portion 4 of the lower row power terminal 32 contact each other.

Figure 7:
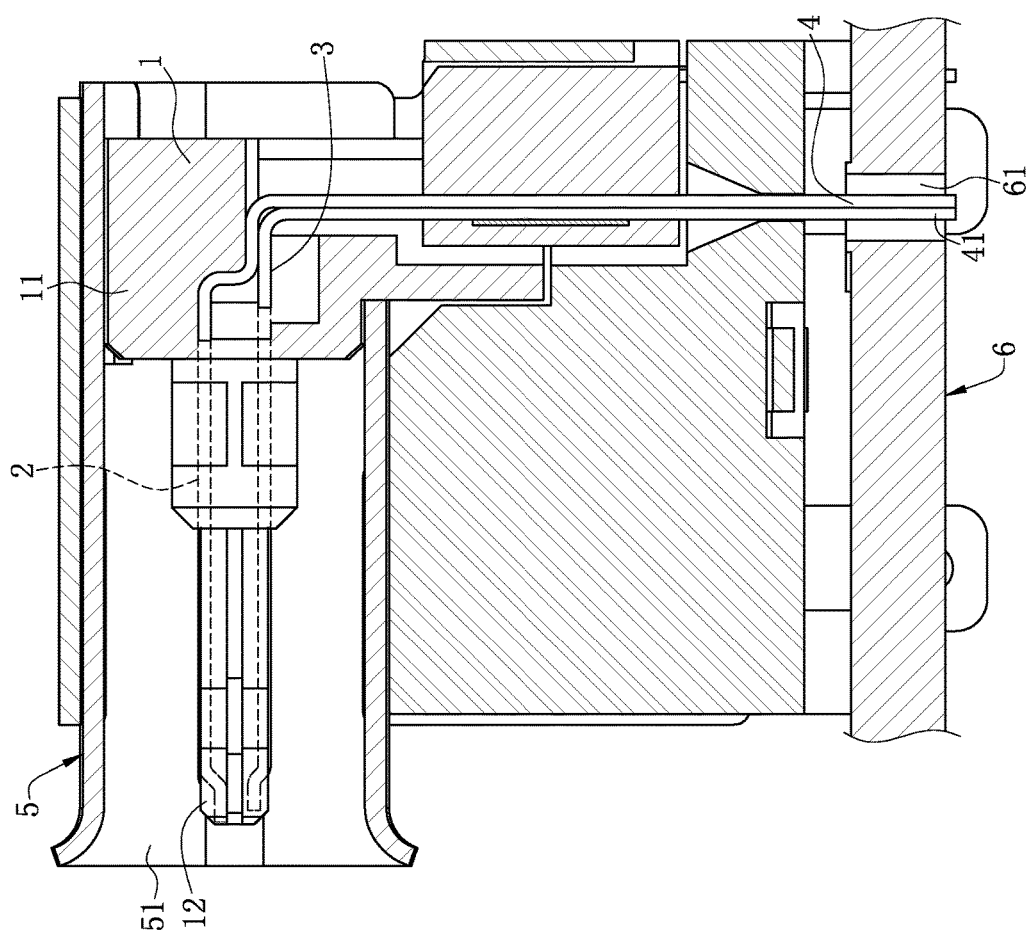
FIG. 7 is a local sectional view of an electrical connector according to a second embodiment of the present invention.
Figure 8:
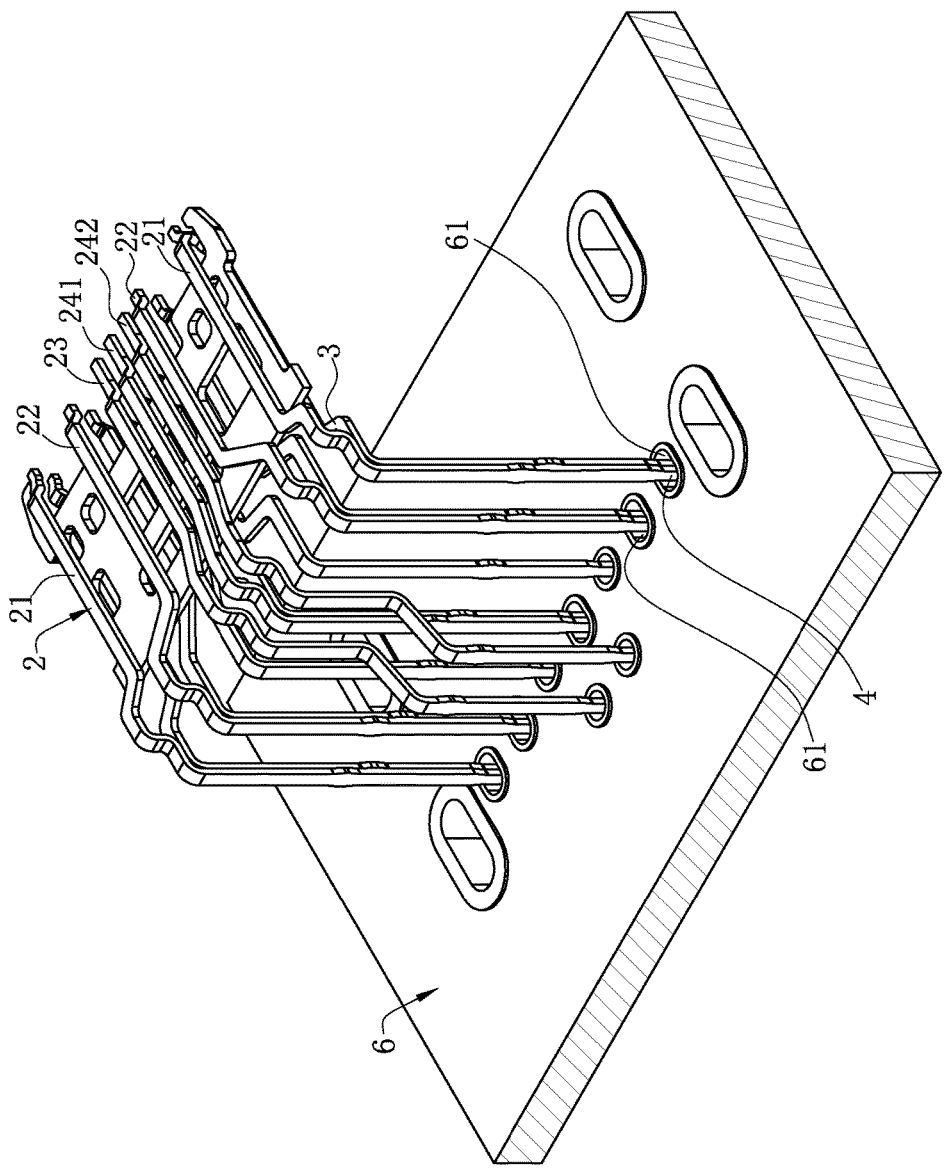
FIG. 8 is a schematic three-dimensional assembly view of upper row terminals and lower row terminals of the electrical connector according to the second embodiment of the present invention.

The electrical connector according to a second embodiment of the present invention is shown in FIG. 7 and FIG. 8, and is used for being electrically connected to a circuit board 6. The circuit board 6 has multiple soldering holes 61. The difference between the second embodiment and the first embodiment lies in that: the soldering portions 4 of the multiple upper row terminals 2 and the soldering portions 4 of the multiple lower row terminals 3 are soldered to the circuit board 6 in a through hole technology soldering manner. Specifically, the front plate surface of the soldering portion 4 of the upper row positive terminal 241 and the rear plate surface of the soldering portion 4 of the lower row positive terminal 341 contact each other and are located in the same soldering hole 61, the front plate surface of the soldering portion 4 of the upper row ground terminal 21 and the rear plate surface of the soldering portion 4 of the lower row ground terminal 31 contact each other and are located in the same soldering hole 61, and the front plate surface of the soldering portion 4 of the upper row power terminal 22 and the rear plate surface of the soldering portion 4 of the lower row power terminal 32 contact each other and are located in the same soldering hole 61. Herein, detailed descriptions will not be further made.

In summary, the electrical connector according to certain embodiments of the present invention has the following beneficial advantages:

(1) By means of contact between the soldering portion 4 of the upper row signal terminal 24 and the soldering portion 4 of the lower row signal terminal 34, a transmission signal of the upper row signal terminal 24 and a transmission signal of the lower row signal terminal 34 are directly combined, and the signals do not need to be combined by means of other procedures, thereby saving the cost. Moreover, there are more conducted parts in the electrical connector, and therefore the transmission current is larger. The soldering portion 4 of the upper row signal terminal 24 and the soldering portion 4 of the lower row signal terminal 34 contact each other and are soldered in the same soldering hole 61, such that the quantity of the soldering holes 61 in the circuit board 6 can be reduced, the processing procedures of the circuit board 6 and space on the circuit board 6 are saved, and the number of times for soldering can be reduced, thereby reducing the reject ratio caused by soldering error.

(2) The soldering portion 4 of the upper row positive terminal 241 is in plate surface contact with the soldering portion 4 of the lower row positive terminal 341, and the soldering portions 4 of the upper row positive terminal 241 and the lower row positive terminal 341 are directly enabled to be in plate surface contact with each other without processing the shapes thereof, such that the procedures can be saved while the signals are combined, thereby improving the production efficiency.

(3) The soldering portions 4 of the multiple upper row terminals 2 are arranged in the first row 41 and the second row 42 front and back, the soldering portion 4 of the upper row ground terminal 21, the soldering portion 4 of the upper row power terminal 22 and the soldering portion 4 of the upper row positive terminal 241 are located in the first row 41, the soldering portion 4 of the upper row detection terminal 23 and the soldering portion 4 of the upper row negative terminal 242 are located in the second row 42, and the soldering portions 4 of the multiple lower row terminals 3 and the first row 41 are arranged in a row. The soldering portions 4 of the multiple upper row terminals 2 and the soldering portions 4 of the multiple lower row terminals 3 are arranged in two rows, such that all the soldering portions 4 will not be arranged densely, thereby reducing the soldering difficulty.

(4) Due to contact between the soldering portion 4 of the upper row ground terminal 21 and the soldering portion 4 of the lower row ground terminal 31, the electrical connector has more grounded parts, being larger in ground area, so as to enhance the ground effect. Due to contact between the soldering portion 4 of the upper row power terminal 22 and the soldering portion 4 of the lower row power terminal 32, the transmission area of a current is larger, and the transmission speed of the current is increased.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments are chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector, comprising:
    an insulating body, having a base and a tongue extending from one side of the base; and
    a plurality of upper row terminals and a plurality of lower row terminals fixed in the insulating body,
    wherein each of the upper row terminals and the lower row terminals has a soldering portion extending out of the insulating body, the upper row terminals comprise at least one upper row signal terminal, the lower row terminals comprise at least one lower row signal terminal, and the soldering portion of the upper row signal terminal is in contact with the soldering portion of the lower row signal terminal; and
    wherein the upper row terminals are exposed upward from the tongue, the lower row terminals are exposed downward from the tongue, and a shielding shell is sleeved over the tongue to form an insertion space.

2. The electrical connector of claim 1, wherein the soldering portion of the upper row signal terminal and the soldering portion of the lower row signal terminal are in plate surface contact.

3. The electrical connector of claim 1, wherein the upper row signal terminal comprises an upper row positive terminal, the lower row signal terminal comprises a lower row positive terminal, and the soldering portion of the upper row positive terminal and the soldering portion of the lower row positive terminal are in plate surface contact.

4. The electrical connector of claim 1, wherein the upper row terminals comprise at least one upper row ground terminal, at least one upper row power terminal and at least one upper row detection terminal, the upper row signal terminal comprises an upper row positive terminal and an upper row negative terminal, the lower row terminals comprise at least one lower row ground terminal, at least one lower row power terminal and at least one lower row detection terminal, and the lower row signal terminal comprises a lower row positive terminal and a lower row negative terminal.

5. The electrical connector of claim 4, wherein the soldering portions of the upper row terminals are arranged in a first row and a second row a front and back direction, the soldering portion of the upper row ground terminal, the soldering portion of the upper row power terminal and the soldering portion of the upper row positive terminal are located in the first row, the soldering portion of the upper row detection terminal and the soldering portion of the upper row negative terminal are located in the second row, and the soldering portions of the lower row terminals and the first row are arranged in a row.

6. The electrical connector of claim 4, wherein the soldering portion of the upper row ground terminal is in contact with the soldering portion of the lower row ground terminal, and the soldering portion of the upper row power terminal is in contact with the soldering portion of the lower row power terminal.

7. An electrical connector, comprising:
    an insulating body; and
    a plurality of upper row terminals and a plurality of lower row terminals fixed in the insulating body,
    wherein each of the upper row terminals and the lower row terminals has a soldering portion extending out of the insulating body, and the soldering portion of the upper row signal terminal is in contact with the soldering portion of the lower row signal terminal;

wherein the upper row terminals comprise at least one upper row signal terminal, at least one upper row ground terminal, at least one upper row power terminal and at least one upper row detection terminal, and the upper row signal terminal comprises an upper row positive terminal and an upper row negative terminal; and wherein the lower row terminals comprise at least one lower row signal terminal, at least one lower row ground terminal, at least one lower row power terminal and at least one lower row detection terminal, and the lower row signal terminal comprises a lower row positive terminal and a lower row negative terminal.

8. An electrical connector for being electrically connected to a circuit board, the circuit board comprising at least one soldering hole, and the electrical connector comprising:

an insulating body, having a base and a tongue extending from one side of the base; and a plurality of upper row terminals and a plurality of lower row terminals fixed in the insulating body, wherein each of the upper row terminals and the lower row terminals has a soldering portion extending out of the insulating body, the upper row terminals comprise at least one upper row signal terminal, the lower row terminals comprise at least one lower row signal terminal, and the soldering portion of the upper row signal terminal and the soldering portion of the lower row signal terminal contact each other and are located in a same soldering hole of the at least one soldering hole; and wherein the upper row terminals are exposed upward from the tongue, the lower row terminals are exposed downward from the tongue, and a shielding shell is sleeved over the tongue to form an insertion space.

9. The electrical connector of claim 8, wherein the soldering portion of the upper row signal terminal and the soldering portion of the lower row signal terminal are in plate surface contact.

10. The electrical connector of claim 8, wherein the upper row signal terminal comprises an upper row positive terminal, the lower row signal terminal comprises a lower row positive terminal, and the soldering portion of the upper row positive terminal and the soldering portion of the lower row positive terminal contact each other and are located in the same soldering hole.

11. The electrical connector of claim 8, wherein the soldering portion of each of the upper row terminals and the soldering portion of each of the lower row terminals are soldered to the circuit board in through hole technology soldering manner.

12. The electrical connector of claim 8, wherein the upper row terminals comprise at least one upper row ground terminal, at least one upper row power terminal and at least one upper row detection terminal, the upper row signal terminal comprises an upper row positive terminal and an upper row negative terminal, the lower row terminals comprise at least one lower row ground terminal, at least one lower row power terminal and at least one lower row detection terminal, and the lower row signal terminal comprises a lower row positive terminal and a lower row negative terminal.

13. The electrical connector of claim 12, wherein the soldering portions of the upper row terminals are arranged in a first row and a second row front and back, the soldering portion of the upper row ground terminal, the soldering portion of the upper row power terminal and the soldering portion of the upper row positive terminal are located in the first row, the soldering portion of the upper row detection terminal and the soldering portion of the upper row negative terminal are located in the second row, and the soldering portions of the lower row terminals and the first row are arranged in a row.

14. The electrical connector of claim 12, wherein the soldering portion of the upper row ground terminal and the soldering portion of the lower row ground terminal contact each other and are located in a same soldering hole, and the soldering portion of the upper row power terminal and the soldering portion of the lower row power terminal contact each other and are located in another same soldering hole.

15. The electrical connector of claim 7, wherein the insulating body further has a base and a tongue extending from one side of the base, the upper row terminals are exposed upward from the tongue, the lower row terminals are exposed downward from the tongue, and a shielding shell is sleeved over the tongue to form an insertion space.

16. The electrical connector of claim 7, wherein the soldering portion of the upper row signal terminal and the soldering portion of the lower row signal terminal are in plate surface contact.

17. The electrical connector of claim 7, wherein the upper row signal terminal comprises an upper row positive terminal, the lower row signal terminal comprises a lower row positive terminal, and the soldering portion of the upper row positive terminal and the soldering portion of the lower row positive terminal are in plate surface contact.

18. The electrical connector of claim 7, wherein the soldering portions of the upper row terminals are arranged in a first row and a second row a front and back direction, the soldering portion of the upper row ground terminal, the soldering portion of the upper row power terminal and the soldering portion of the upper row positive terminal are located in the first row, the soldering portion of the upper row detection terminal and the soldering portion of the upper row negative terminal are located in the second row, and the soldering portions of the lower row terminals and the first row are arranged in a row.

19. The electrical connector of claim 7, wherein the soldering portion of the upper row ground terminal is in contact with the soldering portion of the lower row ground terminal, and the soldering portion of the upper row power terminal is in contact with the soldering portion of the lower row power terminal.

* * * * *